(12) United States Patent
Park et al.

(10) Patent No.: US 9,583,548 B2
(45) Date of Patent: Feb. 28, 2017

(54) ORGANIC LIGHT EMITTING DISPLAY DEVICE COMPRISING LIGHT-SHIELDING PATTERNS AND METHOD FOR MANUFACTURING THE SAME

(71) Applicant: LG Display Co., Ltd., Seoul (KR)

(72) Inventors: Mi-Kyung Park, Busan (KR); Ki-Sul Cho, Gyeongsangbuk-do (KR); Jeong-Hwan Kim, Seoul (KR); Ki-Su Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/508,053

(22) Filed: Oct. 7, 2014

(65) Prior Publication Data

US 2015/0187856 A1   Jul. 2, 2015

(30) Foreign Application Priority Data

Dec. 27, 2013   (KR) .......................... 10-2013-0165156
Sep. 22, 2014   (KR) .......................... 10-2014-0125780

(51) Int. Cl.
   *H01L 27/32*   (2006.01)

(52) U.S. Cl.
   CPC ........ *H01L 27/3272* (2013.01); *H01L 27/322* (2013.01); *H01L 27/3276* (2013.01)

(58) Field of Classification Search
   CPC .............. H01L 27/322; H01L 27/3246; H01L 27/3258; H01L 27/3272; H01L 27/3276; H01L 31/02162; H01L 31/02164; H01L 51/5036
   See application file for complete search history.

(56) References Cited

U.S. PATENT DOCUMENTS

| 2002/0003588 A1* | 1/2002 | Okada .............. G02F 1/136227 349/42 |
| 2002/0080309 A1* | 6/2002 | Bang .................... G02F 1/1362 349/110 |
| 2003/0038910 A1* | 2/2003 | Nagano ............. G02F 1/136209 349/113 |
| 2005/0219436 A1* | 10/2005 | Kwon .............. G02F 1/136209 349/44 |
| 2007/0295962 A1* | 12/2007 | Choi .................. H01L 27/1214 257/59 |

(Continued)

*Primary Examiner* — Eduardo A Rodela
*Assistant Examiner* — Christopher M Roland
(74) *Attorney, Agent, or Firm* — Morgan, Lewis & Bockius LLP

(57) ABSTRACT

Provided are an organic light emitting display (OLED) device and method for manufacturing the same. The OLED device includes: a plurality of gate lines in one direction on a substrate, a plurality of light-shielding patterns corresponding to at least parts of peripheries of the respective pixel regions on the substrate, the light-shielding patterns spaced apart from the gate lines, at least one insulating film covering the substrate, the gate lines, and the light-shielding patterns, a plurality of data lines in another direction crossing the gate lines on the insulating film to define the pixel areas, a passivation film covering the insulating film and the data lines, a plurality of color filters in the pixel areas on the passivation film, an over-coating film evenly covering the passivation film and covering the color filters, and a plurality of organic light emitting elements in the pixel areas on the over-coating film.

18 Claims, 22 Drawing Sheets

(56) References Cited

U.S. PATENT DOCUMENTS

2008/0023717 A1\* 1/2008 Choi .................. H01L 27/3272
 257/98
2010/0102320 A1\* 4/2010 Chung ............... H01L 27/1214
 257/59

\* cited by examiner

ORGANIC LIGHT EMITTING DISPLAY DEVICE COMPRISING LIGHT-SHIELDING PATTERNS AND METHOD FOR MANUFACTURING THE SAME

CROSS-REFERENCE TO RELATED APPLICATION(S)

The present application claims benefit and priority under 35 U.S.C. §119(a) of Korean Patent Application No. 10-2013-0165156, filed on Dec. 27, 2013, and Korean Patent Application No. 10-2014-0125780, filed on Sep. 22, 2014, the entire disclosures of which are hereby incorporated by reference herein for all purposes.

BACKGROUND

1. Technical Field

The following description relates to an organic light emitting display device to improve image quality and a method for manufacturing the same.

2. Discussion of the Related Art

The recent advent of an information-dependent age has brought about rapid development in the field of displays that visually displays electrical information signals. In this regard, research to impart functions such as thinness, weight reduction, and low power consumption to a variety of flat panel displays having superior properties is underway.

Representative examples of flat panel displays include liquid crystal displays (LCDs), plasma display panels (PDPs), field emission displays (FEDs), electro-luminescence displays (ELDs), electro-wetting displays (EWDs), organic light emitting displays (OLEDs), and the like.

Such a flat panel display necessarily includes a flat display panel. The flat display panel has a structure in which a pair of substrates are joined to each other such that they face each other via an inherent light-emitting material or a polarization material and includes a display surface in which a display area and a periphery thereof (i.e., a non-display area) are defined. The display area is defined by a plurality of pixel areas.

Among the flat panel displays, the organic light emitting display (OLED) devices display an image using organic light emitting elements which spontaneously emit light. That is, the organic light emitting display device includes a plurality of organic light emitting elements corresponding to a plurality of pixel areas.

As such, the organic light emitting display device displays an image using the organic light emitting element corresponding to the each pixel area, thus eliminating the necessity of black matrices to prevent light leakage in the periphery of each pixel area.

However, in a general organic light emitting display device, light emitted from the exterior or from adjacent pixel areas is reflected by metal patterns, which causes generation of light leakage in the periphery of the pixel area. For this reason, there are problems such as distortion of color coordinates, deterioration in contrast ratio, and deterioration in image quality.

Accordingly, a polarizing film may be adhered to the display surface in order to prevent light leakage. In this case, problems such as deterioration in brightness and an increase in manufacturing cost are generated due to the presence of the polarizing film.

Alternatively, in order to prevent light leakage, a black matrix may be formed at the periphery of each pixel area. In this case, there are problems in that another mask process for forming the black matrix needs to be performed, simplification of the overall manufacturing process is difficult due to difficult patterning of the black matrix, and reliability is thus deteriorated.

SUMMARY

Accordingly, embodiments of the present application are directed to an organic light emitting display device and method for manufacturing the same that substantially obviate one or more problems due to the limitations and disadvantages of the related art.

An object of embodiments is to provide an organic light emitting display device to prevent light leakage at a periphery in each pixel area without forming a polarizing film and/or a black matrix, and thus to improve image quality, and a method for manufacturing the same.

Advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose according to one aspect of the invention, there is provided an organic light emitting display (OLED) device including a plurality of pixel areas defined in a display area, including: a plurality of gate lines disposed in one direction in the display area on a substrate, a plurality of light-shielding patterns formed to correspond to at least parts of peripheries of the respective pixel areas on the substrate, the light-shielding patterns being spaced apart from the gate lines, at least one insulating film formed over the substrate, the insulating film covering the gate lines and the light-shielding patterns, a plurality of data lines disposed in another direction crossing the gate lines in the display area on the insulating film to define the pixel areas, a passivation film disposed over the insulating film, the passivation film covering the data lines, a plurality of color filters respectively formed in the pixel areas on the passivation film, an over-coating film evenly formed over the passivation film, the over-coating film covering the color filters, and a plurality of organic light emitting elements respectively formed in the pixel areas on the over-coating film.

In another aspect, there is provided a method for manufacturing an organic light emitting display (OLED) device including a plurality of pixel areas defined in a display area, the method including: forming a plurality of gate lines in one direction on a substrate, forming light-shielding patterns corresponding to at least parts of peripheries of respective pixel areas, the light-shielding patterns being spaced apart from the gate lines, forming at least one insulating film over the substrate, such that the gate insulating film covers the gate lines and the light-shielding patterns, forming a plurality of data lines in another direction on the interlayer insulating film, such that the data lines cross the gate lines, to define the pixel areas, forming a passivation film over the insulating film, such that the passivation film covers the data lines, forming a plurality of color filters in the respective pixel areas on the passivation film, evenly forming an over-coating film over the passivation film, such that the over-coating film covers the color filters, and forming a plurality of organic light emitting elements on the over-coating film, such that the organic light emitting elements correspond to the respective pixel areas, wherein the formation of the data lines includes forming the data lines, such that the light-shielding patterns overlap the data lines at peripheries of the respective pixel areas.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the invention.

Figure 1:
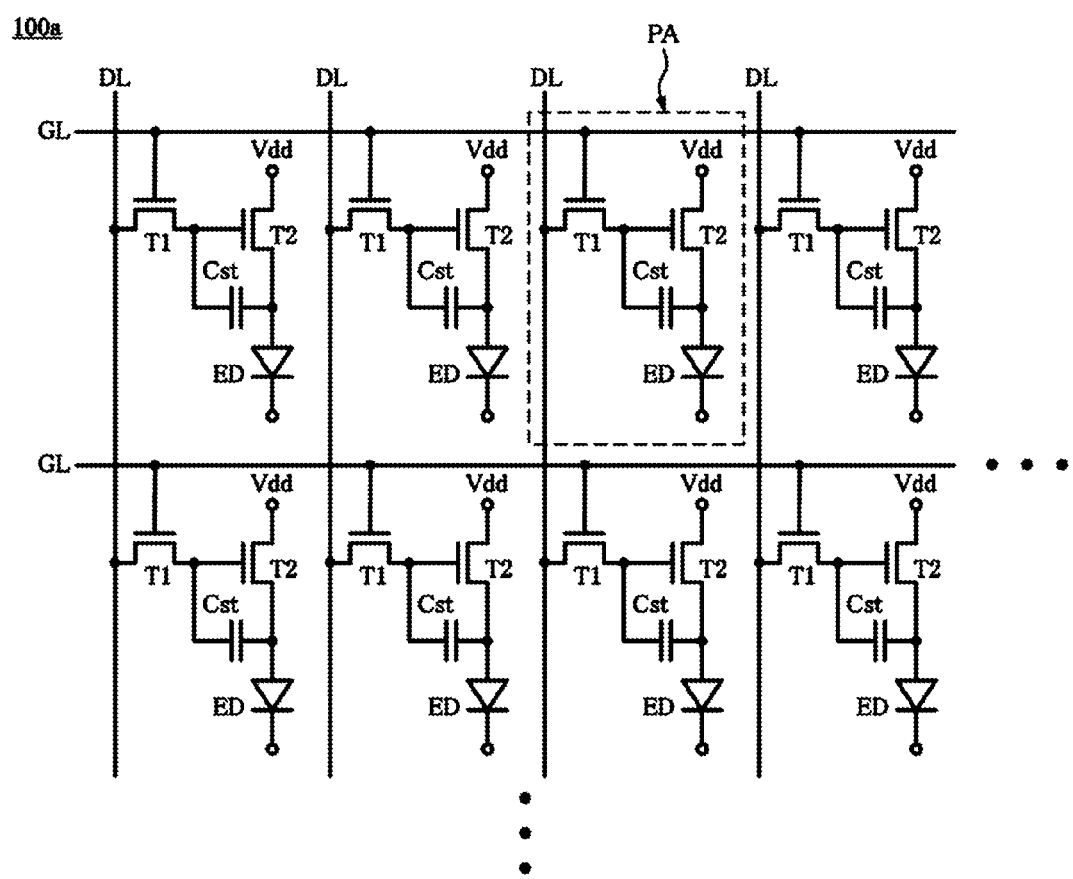
FIG. 1 is a circuit diagram illustrating an organic light emitting display device according to an embodiment.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present invention, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

Hereinafter, embodiments will be described in detail with reference to the accompanying drawings.

Figure 2:
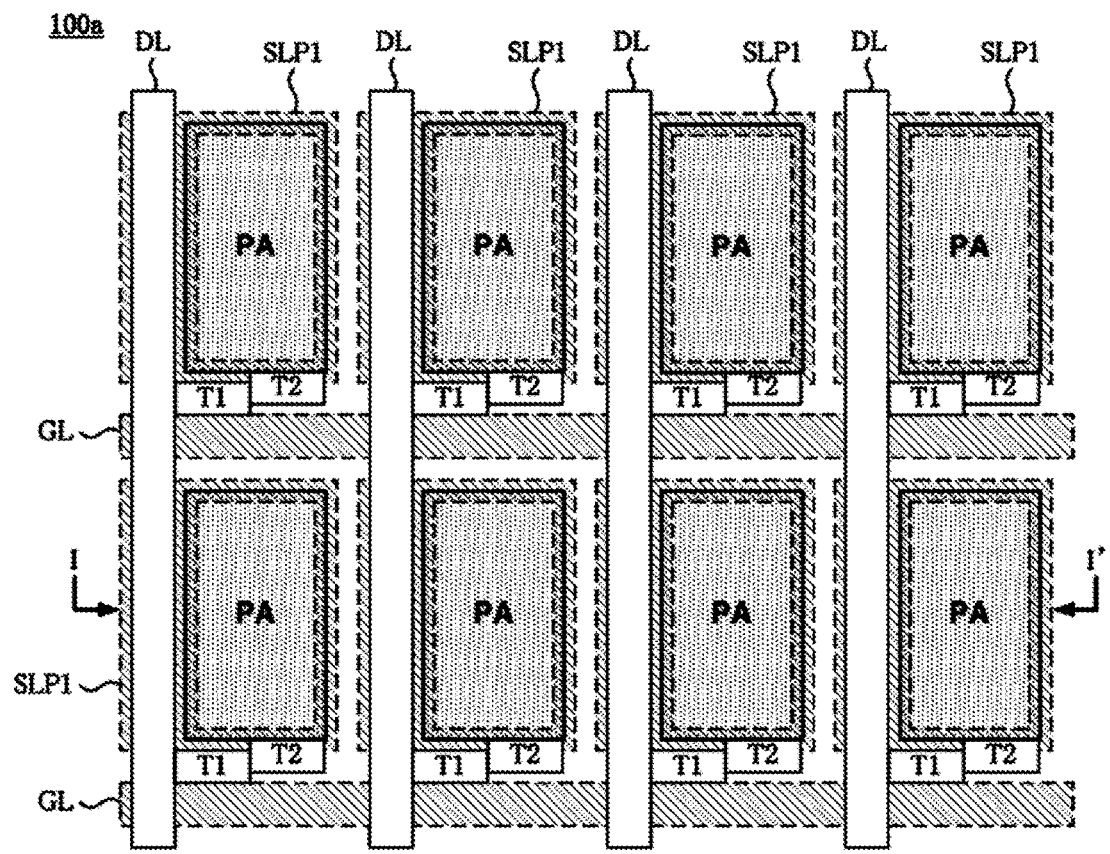
FIG. 2 is a plan view illustrating the organic light emitting display device according to an embodiment.
Figure 3:
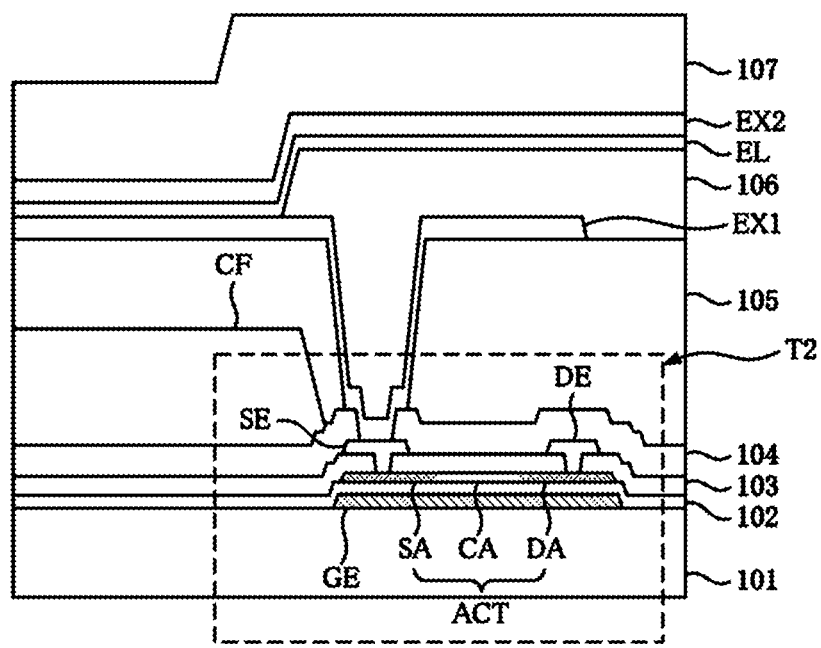
FIG. 3 is a partial sectional view illustrating an example of a second thin film transistor and an organic light emitting element of FIG. 2.
Figure 4:
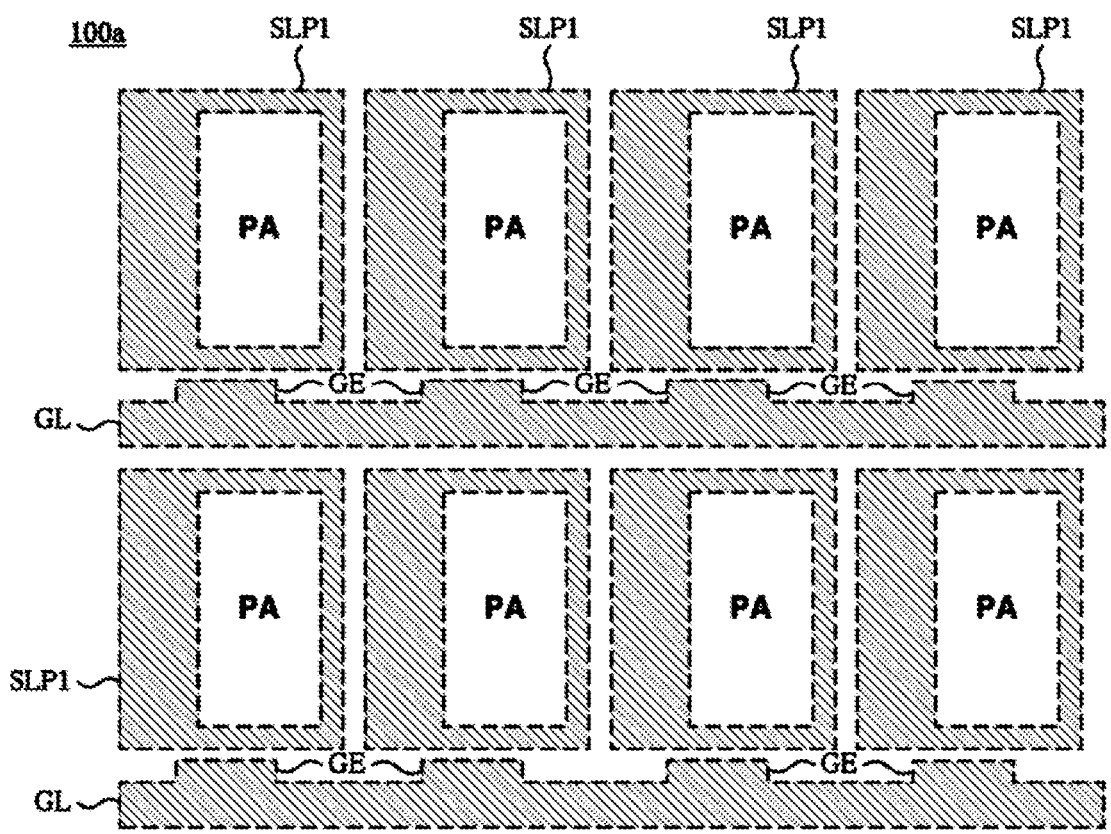
FIG. 4 is a plan view illustrating gate lines and light-shielding patterns of FIG. 2.
Figure 5:
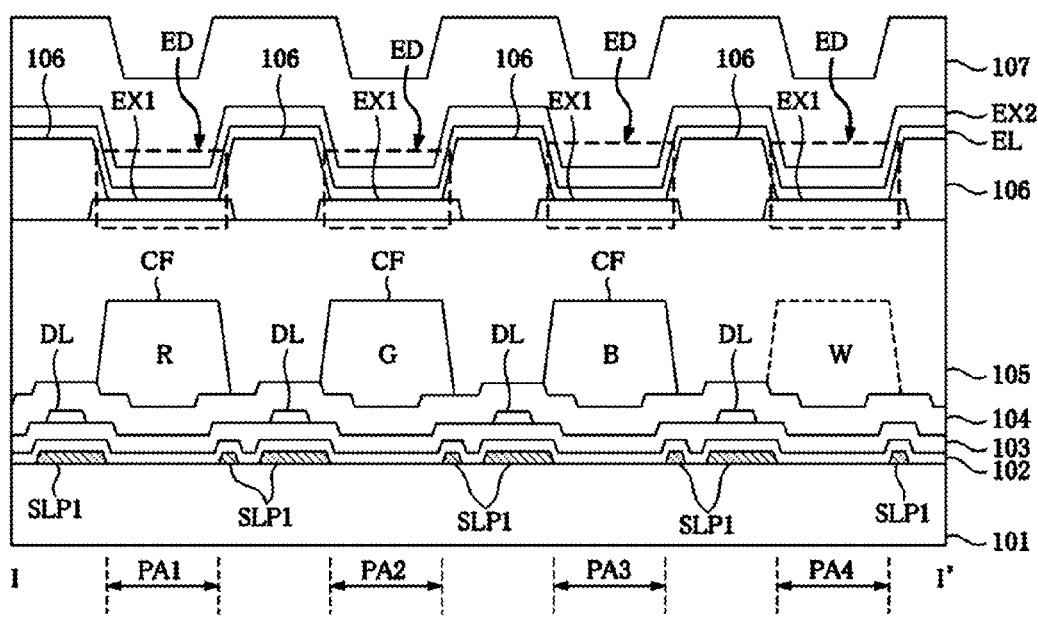
FIG. 5 is a sectional view taken along the line I-I' of FIG. 2.

FIG. 1 is a circuit diagram illustrating an organic light emitting display device according to an embodiment. FIG. 2 is a plan view illustrating the organic light emitting display device according to an embodiment. FIG. 3 is a partial sectional view illustrating a second thin film transistor and an organic light emitting element of FIG. 2. FIG. 4 is a plan view illustrating gate lines and light-shielding patterns of FIG. 2. FIG. 5 is a sectional view taken along the line I-I' of FIG. 2.

As shown in the examples of FIGS. 1 and 2, the organic light emitting display device 100a according to an embodiment may include a plurality of gate lines GL and a plurality of data lines DL crossing each other to define a plurality of pixel areas PA in a display region that can display an image. The organic light emitting display device 100a further include first and second thin film transistors T1, T2, a storage capacitor Cst which are formed in each pixel area PA. In addition, as shown in FIG. 1, the organic light emitting display device 100a may further include a plurality of organic light emitting elements, for example, emission diodes EDs, formed in an emission region of each pixel area PA. The first thin film transistor T1 is formed at the intersections between the gate lines GL and the data lines DL in the respective pixel areas PA, and connected to the second thin film transistor T2. The second thin film transistor T2 is connected between a drive power supply ($V_{dd}$) to the organic light emitting element ED. In this regards, when the first thin film transistor T1 is turned on based on a scan signal of the gate line GL, the second thin film transistor T2 may be turned on based on a data signal of the data line DL which is forwarded through the first thin film transistor T1. And, when the second transistor T2 is turned on, the second thin film transistor T2 may forward a driving current based on the drive power supply ($V_{dd}$) to the organic light emitting element ED and the storage capacitor Cst.

The gate lines GL may be formed in one direction (e.g., in a horizontal direction in the example of FIGS. 1 and 2) in the display region. The data lines DL may be formed in another direction (e.g., in a vertical direction in the example of FIGS. 1 and 2) crossing the gate lines GL. The pixel areas PA may be defined in the display region by forming the gate lines GL and the data lines DL such that they cross each other in the display region.

Each of the first and second thin film transistors T1, T2 may include a gate electrode, a source electrode, and a drain electrode. Regarding the first thin film transistor T1, the gate electrode may be connected to the gate line GL, and one of the source electrode and the drain electrodes may be connected to the data line DL (for example, the drain electrodes in the FIG. 1 example are each connected to a data line DL) and the other of the source and drain electrodes not connected to the data line DL may be connected to the second thin film transistor T2 (for example, the source electrodes in the FIG. 1 example are each connected to a gate electrode of a second thin film transistor T2). Regarding the second thin film transistor T2, the gate electrode GE may be connected to the first thin film transistor T1, and one of the source electrode SE and drain electrodes DE may be connected to the drive power supply ($V_{dd}$) and the other of the source and drain electrodes SE, DE not connected to the drive power supply ($V_{dd}$) may be connected to an organic light emitting element ED, as shown in FIGS. 1 and 3.

Each organic light emitting element ED may connect between the second thin film transistor T2 and a common voltage $V_{com}$. Each organic light emitting element ED may emit light, based on a driving voltage supplied from each second thin film transistor T2. For example, as shown in FIG. 3, the gate electrode GE of each of the first and second thin film transistors T1, T2 may be formed on the substrate 101.

Furthermore, although not shown in FIG. 3 in detail, the gate line (GL of FIGS. 1 and 2) may be formed on the substrate 101, similarly as is shown for the gate electrode GE of each of the first and second thin film transistors T1, T2. For example, the gate electrode GE of the first thin film transistor T1 may branch from the gate line GL. The gate line GL and the gate electrode GE may be covered with a gate insulating film 102 formed over the entire surface of the substrate 101.

An active layer ACT may be formed on the gate insulating film 102 and may overlap at least a part of the gate electrode GE. The active layer ACT may be formed of at least one of: an oxide semiconductor, polysilicon (crystalline silicon), and amorphous silicon (a-Si, non-crystalline silicon).

In addition, the active layer ACT may include a channel area CA, a source area SA, and a drain area DA. The source area SA and the drain area DA may be disposed at both sides of the channel area CA. For example, the source area SA and the drain area DA may be further doped with impurities such that the source area SA and the drain area DA have higher electron mobility than that of the channel area CA.

The active layer ACT may be covered with an interlayer insulating film 103 formed over the entire surface of the gate insulating film 102. Regarding each of the first and second thin film transistors T1, T2, the source electrode SE and the drain electrode DE may be formed on the interlayer insulating film 103. The source electrode SE may overlap the source area SA of the active layer ACT, and the drain electrode DE may overlap the drain area DA of the active layer ACT. In addition, the source electrode SE and the drain electrode DE may be spaced apart from each other. In one example, both of the source electrode SE and the drain electrode DE may not overlap the channel area CA of the active layer ACT.

As an example, the source electrode SE may be connected to the source area SA of the active layer ACT via a hole passing through the interlayer insulating film 103 to expose the source area SA. In addition, the drain electrode DE may be connected to the drain area DA of the active layer ACT via a hole passing through the interlayer insulating film 103 to expose the drain area DA.

Although not shown in detail, one of the source electrode and the drain electrode of the first thin film transistor T1 is connected to the data line (DL of FIGS. 1 and 2). (for example, the drain electrode is connected to the data line DL). That is, the data line (e.g., DL in FIGS. 1 and 2) may be formed on the interlayer insulating film 103, similarly to the source electrode SE and the drain electrode DE. In one example, one of the source electrode and the drain electrode of the first thin film transistor T1 may branch from the data line DL. For example, drain electrode DE of the first thin film transistor T1 may branch from the data line DL. Furthermore, one of the source electrode SE and the drain electrode DE of the second thin film transistor T2 is connected to the drive power supply ($V_{dd}$ of FIG. 1). (for example, the drain electrode DE is connected to the drive power supply ($V_{dd}$)). The source electrode SE, the drain electrode DE, and the data line DL may be covered with a passivation film 104 formed over the entire surface of the interlayer insulating film 103.

The organic light emitting display device 100a may further include a color filter CF corresponding to each pixel area PA and formed on the passivation film 104, and an over-coating film 105 evenly formed over the entire surface of the passivation film 104 and covering the color filter CF. The color filter CF may enable light with a certain color to be emitted in each pixel area PA. Through the color filter CF, each pixel area PA may emit red, green, or blue light. Alternatively, each pixel area PA may emit red, green, blue, or white light, as shown in the FIG. 5 example. In this regard, there may be no color filter CF corresponding to a pixel area PA emitting white light, as shown in a dotted line of FIG. 5. These are only examples of colors; embodiments are not limited thereto.

The organic light emitting element ED may be formed on the over-coating film 105. The organic light emitting element ED may include first and second electrodes EX1, EX2 facing each other and an organic light emitting layer EL interposed between first and second electrodes EX1, EX2.

For example, the first electrode EX1 may be formed on the over-coating film 105 and may correspond to each pixel area PA. The first electrode EX1 may be connected to the second thin film transistor T2 via a hole passing through the passivation film 104 and the over-coating film 105. At least a part of one of the source electrode SE and the drain electrode DE of the second thin film transistor T2, not connected to the data line DL, may be exposed via the hole passing through the passivation film 104 and the over-coating film 105, and may be connected to the first electrode EX1. For example, the source electrode SE may be exposed via the hole and is connected to the first electrode EX1.

A periphery of the first electrode EX1 may be covered with a bank 106 formed at the periphery of each pixel area PA on the over-coating film 105. The organic light emitting layer EL may be formed of an organic light emitting material over the entire surface of the first electrode EX1 and the bank 106. The second electrode EX2 may be formed over the entire surface of the organic light emitting layer EL.

In one example, one of the first and second electrodes EX1, EX2 may be formed of a light-transmitting conductive material and the other may be formed of a light-reflecting conductive material. The organic light emitting element ED may be covered with a sealing layer 107 formed on a surface which faces the substrate 101. That is, the sealing layer 107 may be formed over the entire surface of the second electrode EX2 such that the sealing layer 107 faces the substrate 101.

Further description will now be given with reference again to FIG. 2. As shown in the FIG. 2 example, the organic light emitting display device 100a may further include a light-shielding pattern SLP1 disposed in at least a part of the periphery of each pixel region and spaced from the gate line GL.

The light-shielding pattern SLP1 may include a portion overlapping at least the data line DL. That is, the light-shielding pattern SLP1 may overlap the data line DL in another direction (e.g., a vertical direction in the FIG. 2 example). The light-shielding pattern SLP1 may overlap an edge of each of the color filter CF and the organic light emitting element EL which may be elements corresponding to each pixel area PA.

As shown in the FIG. 4 example, the light-shielding pattern SLP1 may surround the each pixel area PA, such that the light-shielding pattern SLP1 may be open in the pixel area PA. In other words, the light-shielding pattern SLP1 may correspond to a periphery of each pixel area PA. That is, the light-shielding pattern SLP1 may be formed to have a moat shape corresponding to each pixel area PA. In addition, the light-shielding pattern SLP1 may be flush with the gate line GL and the gate electrode GE.

As shown in the FIG. 5 example, the light-shielding pattern SLP1 may formed on the substrate 101 and may have the moat shape corresponding to each pixel area PA, e.g., pixel areas PA1, PA2, PA3, PA4. In addition, the light-shielding pattern SLP1 may be covered with at least one insulating film 102 or 103 formed over the entire surface of the substrate 101. That is, the light-shielding pattern SLP1 may be covered with at least the gate insulating film 102 and the interlayer insulating film 103.

The data line DL may be formed on the interlayer insulating film 103 and may overlap the light-shielding pattern SLP1. In addition, the data line DL may be covered with the passivation film 104 formed over the entire surface of the interlayer insulating film 103, similarly to the source electrode SE and the drain electrode DE of each of the first and second thin film transistors T1, T2 formed on the interlayer insulating film 103.

As described above, the color filter CF may be formed in each pixel area PA on the passivation film 104. In the FIG. 5 example, the color filter CF may include a first color filter R of a first pixel area PA1 corresponding to red, a second color filter G of a second pixel area PA2 corresponding to green and a third color filter B of a third pixel area PA3 corresponding to blue. In addition, as shown in the dotted line of the FIG. 5 example, there may be no color filter CF in the fourth pixel area PA4 corresponding to white.

In addition, the organic light emitting element ED may be formed in each pixel area PA on the over-coating film 105, and may be covered with a sealing layer 107. The organic light emitting element ED may include first and second electrodes EX1, EX2 facing each other and an organic light emitting layer EL interposed therebetween.

As shown in FIG. 5, the light-shielding pattern SLP1 may be formed as the moat shape surrounding each pixel area PA. Therefore, the edge of each of the color filter CF and the organic light emitting element ED, which may be elements corresponding to each pixel area PA, may overlap the light-shielding pattern SLP1. As described above, the organic light emitting display device 100a may further include the light-shielding pattern SLP1 formed as the moat shape corresponding to each pixel area PA on the layer being flush with the gate lines GL, that is, on the substrate 101.

The light-shielding pattern SLP1 may shield the data line DL. Accordingly, light emitted from exterior or another adjacent pixel area PA may be reflected by the data line DL, and generation of light leakage at the periphery of the pixel area PA may thus be prevented. That is, light leakage in the pixel area PA may be prevented by the light-shielding pattern SLP1 formed on the substrate 101 with the gate line GL, rather than by a separate polarizing film and a separate black matrix.

For this reason, distortion of color coordinates and deterioration in contrast ratio may be easily prevented and image quality may be thus improved. In addition, deterioration in brightness caused by the polarizing film and deterioration in reliability caused by the black matrix may be prevented. In addition, the light-shielding pattern SLP1 may be formed by a mask process that may be the same as that of the gate line GL, and the manufacture process may not become more complicated, even though the light-shielding pattern SLP1 is further provided.

Meanwhile, the light-shielding pattern SLP1 may be formed in the moat shape surrounding the periphery of the pixel area PA. However, the light-shielding pattern according to an embodiment may have any shape, insulated with another element (for example, the gate line GL) disposed on the substrate 101, while being open in the pixel area PA.

That is, in accordance with an embodiment, the light-shielding pattern may surround the entire periphery of two or more neighboring pixel areas PA adjacent to each other in one direction (e.g., the horizontal direction of the examples of FIGS. 6 to 8), and may be open in each of the two or more neighboring pixel areas PA.

Figure 6:
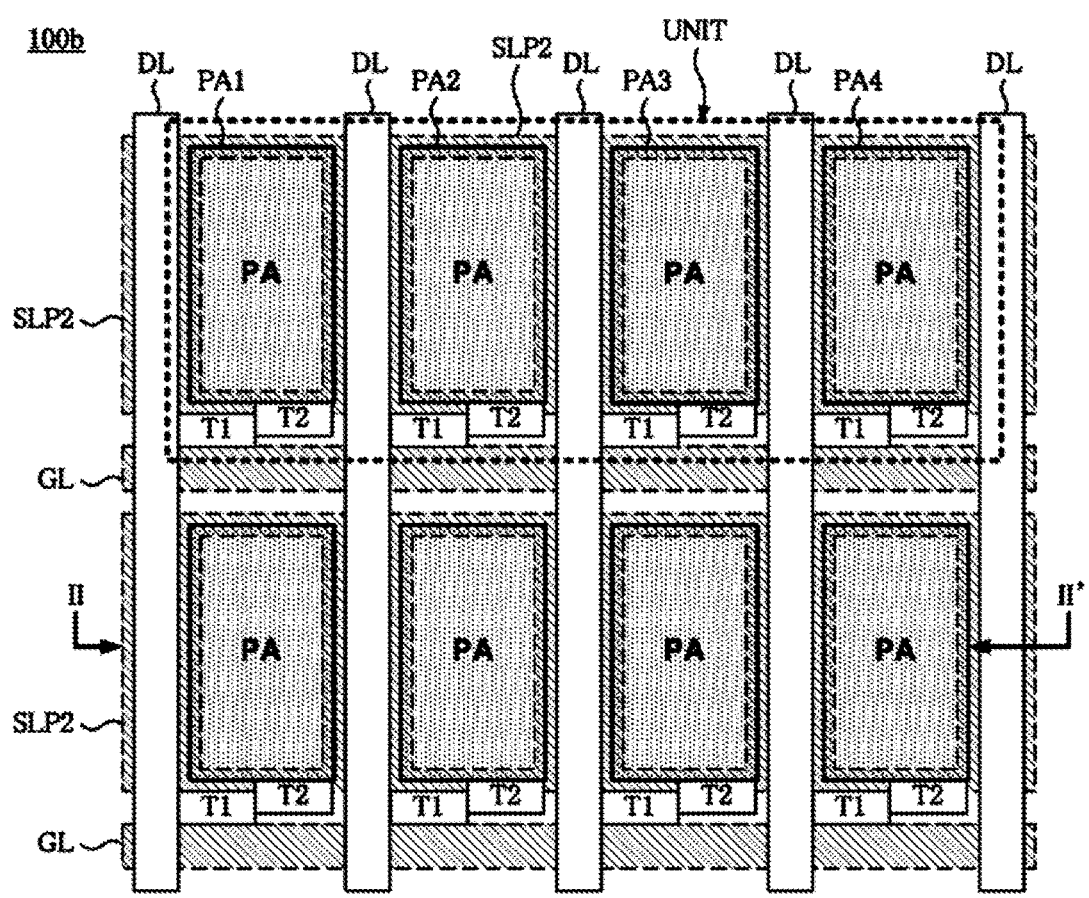
FIG. 6 is a plan view illustrating an organic light emitting display device according to an embodiment.
Figure 7:
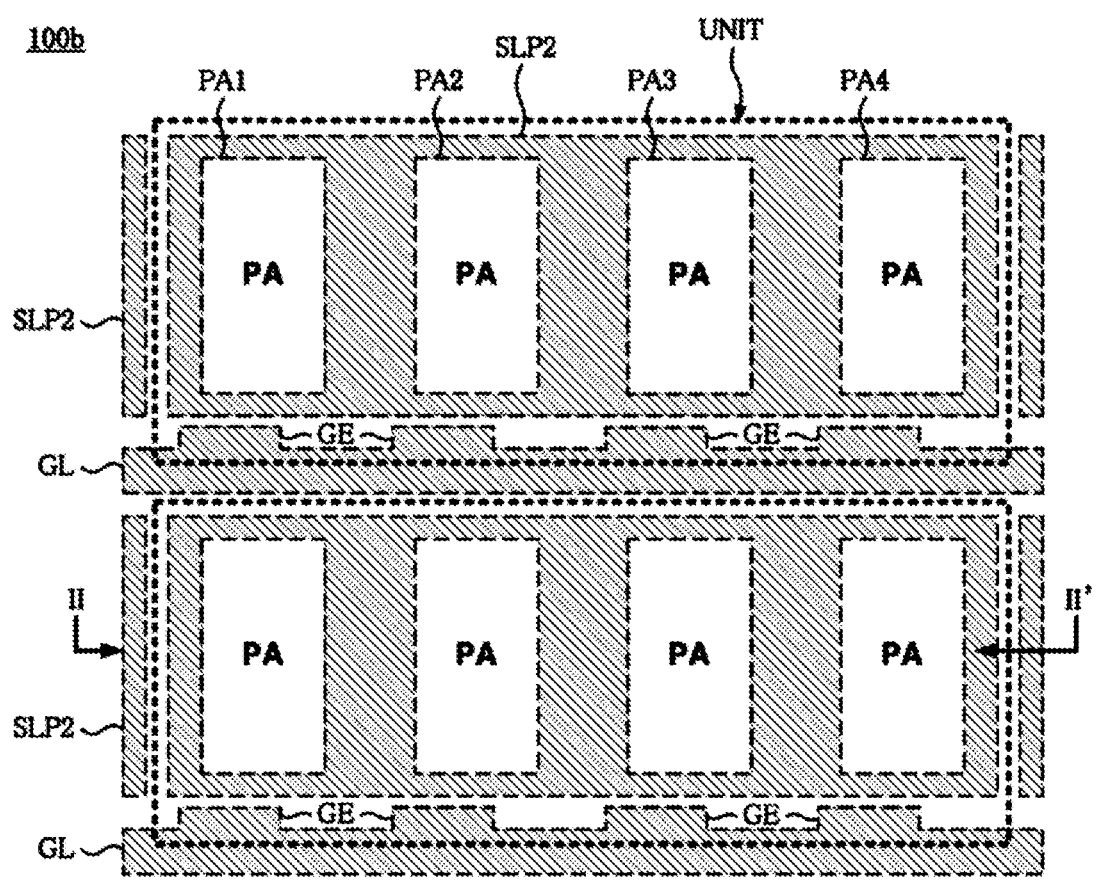
FIG. 7 is a plan view illustrating gate lines and light-shielding patterns of FIG. 6.
Figure 8:
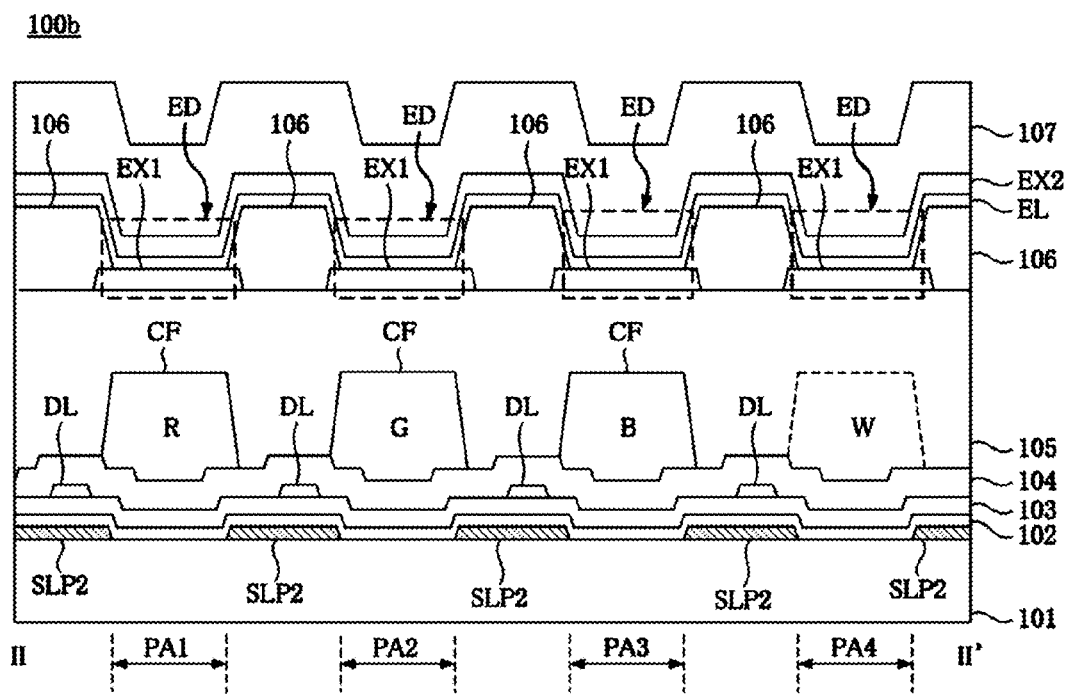
FIG. 8 is a sectional view taken along the line II-II' of FIG. 6.

FIG. 6 is a plan view illustrating an organic light emitting display device according to an embodiment. FIG. 7 is a plan view illustrating gate lines and light-shielding patterns of FIG. 6. FIG. 8 is a sectional view taken along the line II-II' of FIG. 6.

As shown in the examples of FIGS. 6 to 8, the organic light emitting display device 100b is the same as the organic light emitting display device 100a as shown in the examples of FIGS. 1 to 5, except that the light-shielding pattern SLP2 may have a shape other than the moat shape corresponding to the periphery of the pixel area PA, and the same features are thus not repeatedly described below.

As shown in the FIG. 6 example, with regard to the organic light emitting display device 100b, among a plurality of pixel areas PA, two or more neighboring pixel areas PA1, PA2, PA3, PA4 arranged in parallel in one direction (e.g., the horizontal direction in the example of FIG. 6) and emitting different colors of light (for example, red, green, blue, and white) are defined as a unit pixel area UNIT.

For example, the unit pixel area UNIT may include the first to fourth pixel areas PA1, PA2, PA3, PA4. Among the first to fourth pixel areas PA1, PA2, PA3, PA4, in the example of FIG. 6, the first pixel area PA1 may emit red light, the second pixel area PA2 may emit green light, the third pixel area PA3 may emit blue light, and the fourth pixel area PA4 may emit white light.

Alternatively, unlike the example shown in the FIG. 6, the unit pixel area UNIT may be defined as including first to third pixel areas PA1, PA2, PA3 arranged in parallel in one direction (e.g., the horizontal direction in the FIG. 6 example) and may emit red, green, and blue light. These color sets are only examples; embodiments are not limited thereto.

The light-shielding pattern SLP2 may be formed to correspond to each unit pixel area UNIT, rather than to each pixel area PA. In addition, similarly to the light-shielding pattern SLP1 in the FIG. 2 example, the light-shielding pattern SLP2 may include a portion overlapping at least the data line DL. Also, the light-shielding pattern SLP2 may overlap an edge of each of elements, e.g., the color filter CF and the organic light emitting element EL, corresponding to each pixel area PA.

That is, as shown in the FIG. 7 example, the light-shielding pattern SLP2 may be formed as a window shape, surrounding the periphery of each unit pixel area UNIT and being open in each of the neighboring pixel areas PA1, PA2, PA3, PA4 included in the each unit pixel area UNIT. That is, the light-shielding pattern SLP2 may have the window shape corresponding to each unit pixel area UNIT and being open in the neighboring pixel areas PA1, PA2, PA3, PA4 of each unit pixel area UNIT.

In other words, the light-shielding pattern SLP2 may be formed on the periphery of each unit pixel area UNIT and formed between two or more neighboring pixel areas PA1, PA2, PA3, PA4 included in each unit pixel area UNIT. Furthermore, the light-shielding pattern SLP2 may have a mixed shape of the moat shape (like SLP1) corresponding to the periphery of the pixel area PA and a pattern corresponding to boundaries between two or more neighboring pixel areas PA which may be arranged in another direction and may belong to same unit pixel area UNIT.

As shown in the FIG. 8 example, the light-shielding pattern SLP2 may be formed on boundaries between two or more neighboring pixel areas PA included in each unit pixel area UNIT on the substrate 101. Accordingly, a part of the light-shielding pattern SLP2 may overlap the data line DL, and another part thereof may overlap an edge of each of the color filter CF and the organic light emitting element ED, which may be elements corresponding to each pixel area PA.

As such, because the light-shielding pattern SLP2 may be formed to correspond to each unit pixel area UNIT, the number of the light-shielding patterns SLP2 may be less than that of the light-shielding patterns SLP1 described above. Further, a gap between neighboring light-shielding pattern SLP1 or SLP2 may be equal to or greater than a process error in the mask process. Accordingly, the light-shielding patterns SLP2 may have an advantage of a higher resolution, as compared to the light-shielding patterns SLP1, because a gap between the light-shielding patterns SLP2 may also be decreased in proportion to the number of the light-shielding patterns SLP2.

Meanwhile, the light-shielding patterns SLP1 and SLP2 may be formed to correspond to peripheries of the pixel areas PA, and may overlap edges of the color filter CF and the organic light emitting element ED, which may be elements corresponding to the pixel areas PA. The light-shielding patterns SLP1 and SLP2 may block light emitted from the organic light emitting elements ED, and may cause deterioration in brightness of the respective pixel areas PA. Accordingly, the organic light emitting display devices according to embodiments may include a light-shielding pattern formed only in a part of the periphery of each pixel area PA, rather than in an entire periphery of the each pixel area PA.

Figure 9:
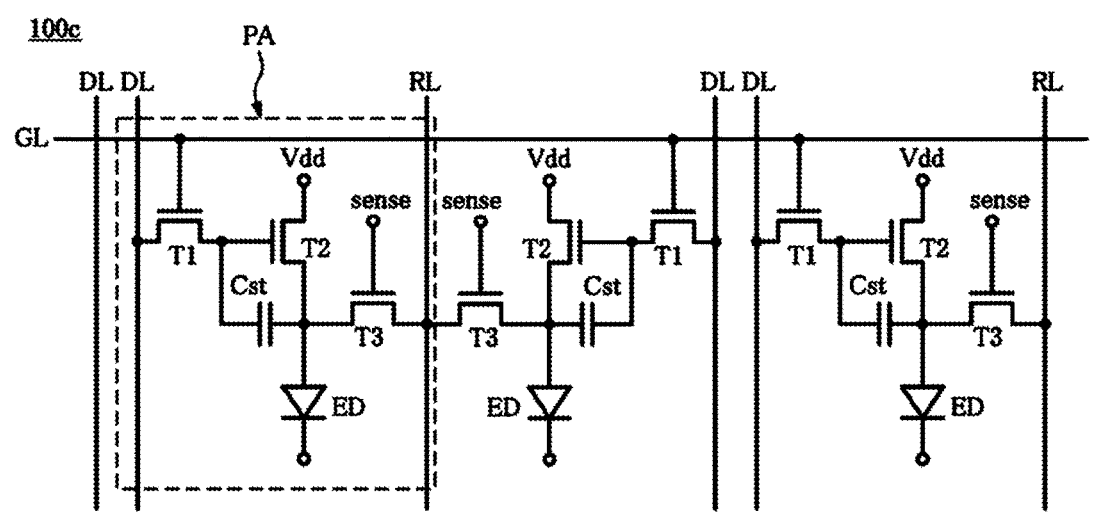
FIG. 9 is a circuit diagram illustrating an organic light emitting display device according to an embodiment.
Figure 10:
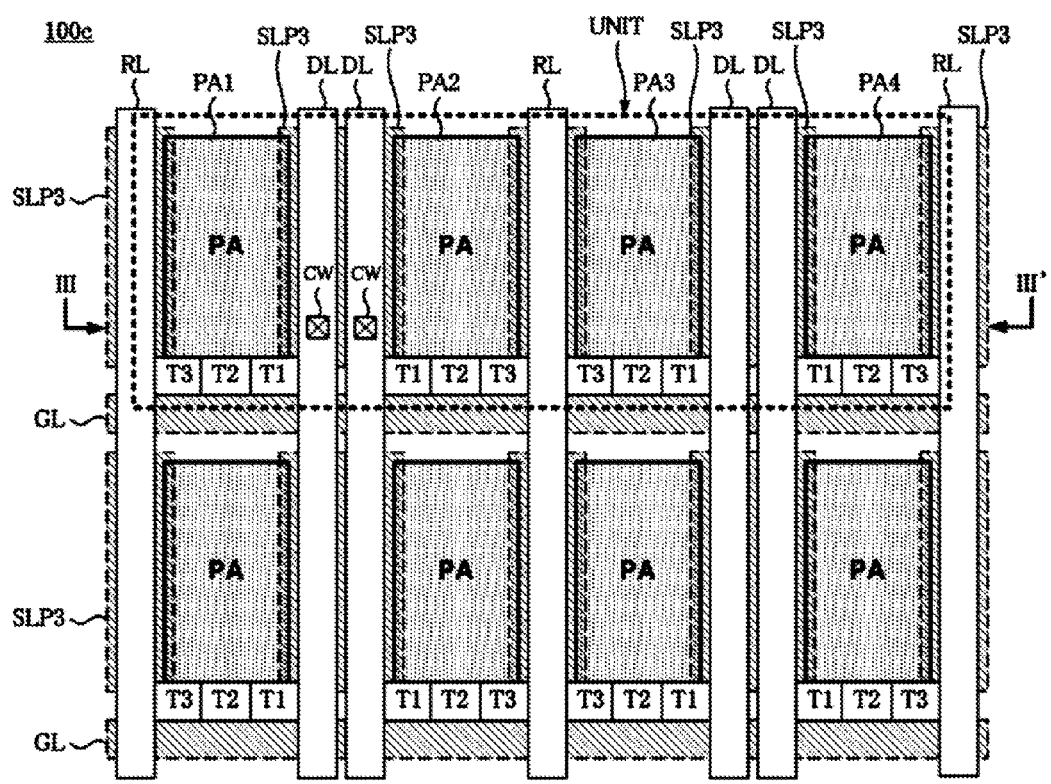
FIG. 10 is a plan view illustrating the organic light emitting display device according to an embodiment.
Figure 11:
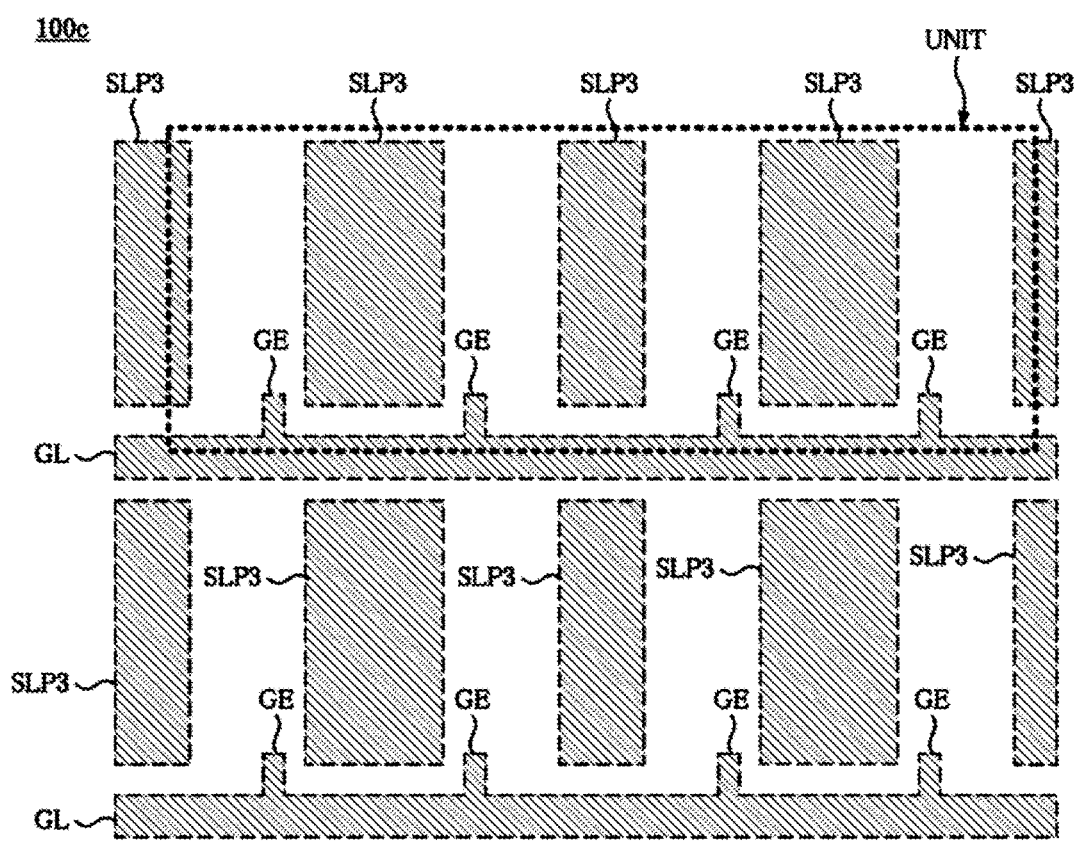
FIG. 11 is a plan view illustrating gate lines and light-shielding patterns of FIG. 10.
Figure 12:
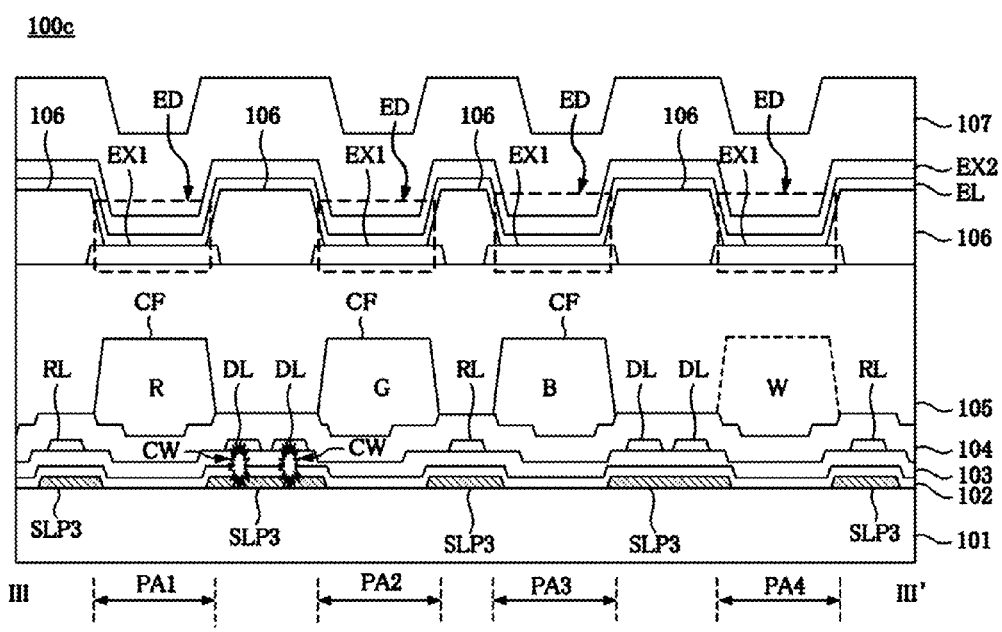
FIG. 12 is a sectional view taken along the line III-III' of FIG. 10.

An organic light emitting display device 100c according to an embodiment will be described with reference to the examples of FIGS. 9 to 12. FIG. 9 is a circuit diagram illustrating an organic light emitting display device according to an embodiment. FIG. 10 is a plan view illustrating the organic light emitting display device according to an embodiment. FIG. 11 is a plan view illustrating gate lines and light-shielding patterns of FIG. 10. FIG. 12 is a sectional view taken along the line III-III' of FIG. 10.

As shown in the examples of FIGS. 10 to 12, the organic light emitting display device 100c is similar to that of the organic light emitting display devices 100a, 100b described above, but light-shielding patterns SLP3 may be respectively formed in only parts of peripheries of the respective pixel areas PA instead of surrounding entire peripheries of respective pixel areas PA. The same features previously described are thus not repeatedly described below.

As shown in FIG. 9, the organic light emitting display device 100c may further include a third transistor T3 formed in each pixel area PA. In response to the third thin film transistor T3 being turned on based on a sense signal (sense), the third thin film transistor T3 may connect each of a storage capacitor Cst and an organic light emitting element ED to a reference line RL, which may initialize each of the storage capacitor Cst and the organic light emitting element ED.

As shown in FIG. 10, the organic light emitting display device 100c may further include the reference line RL formed in another direction (e.g., the vertical direction of the FIG. 10 example) in parallel with the data line DL in a display area. In addition, in one example, two data lines DL may be disposed between two adjacent pixel areas PA arranged in parallel in one direction (e.g., the horizontal direction in the FIG. 10 example). That is, the first thin film transistors T1 of first and second pixel areas PA1, PA2, arranged in parallel in one direction, may be connected to two different data lines DL disposed in parallel between the first and second pixel areas PA1, PA2.

In addition, the reference line RL may be spaced from the data lines DL, and may be disposed between the two pixel areas PA. Therefore, each reference line RL may be shared by the two pixel areas PA disposed at both sides thereof. That is, the third thin film transistors T3 of second and third pixel areas PA2, PA3, arranged in parallel in one direction, may be connected to one reference line RL disposed between the second and third pixel areas PA2, PA3. In other words, the data line DL, connected to the first thin film transistor T1 of the second pixel area PA2, and the reference line RL, connected to the third thin film transistor T3 of the second pixel area PA2, may be formed at both sides of the second pixel area PA2.

As shown in FIG. 11, the light-shielding pattern SLP3 may extend in another direction (e.g., the vertical direction in the FIG. 11 example) to overlap at least the data line DL and the reference line RL. That is, the light-shielding pattern SLP3 may be formed as a line shape extending in another direction along both sides of the periphery of each pixel area PA.

In addition, the light-shielding pattern SLP3 may be flush with the gate line GL and the gate electrode GE. That is, as shown in the FIG. 12 example, similarly to the gate line GL and the gate electrode GE, the light-shielding pattern SLP3 may be formed on the substrate 101 and may be covered with at least one insulating film 102 or 103.

Similarly to the source electrode SE and the drain electrode DE, the data line DL and the reference line RL may be formed on the interlayer insulating film 103 and are covered with the passivation film 104. In addition, each of the data line DL and the reference line RL may overlap the light-shielding pattern SLP3 at the periphery of each pixel area PA.

Further, an edge of each of the color filter CF and the organic light emitting element ED (corresponding to each pixel area PA) adjacent to the data line DL and the reference line RL may overlap the light-shielding pattern SLP3.

Meanwhile, the light-shielding pattern SLP3 may overlap two data lines DL disposed between two adjacent pixel areas PA, and may be a floating island pattern not connected to any signal line, including the gate line GL. Accordingly, in response to one of two adjacent data lines DL being disconnected, the disconnected data line DL may be repaired using the light-shielding pattern SLP3 overlapping a lower part of the two adjacent data lines DL.

That is, as shown in FIGS. 10 and 12, the organic light emitting display device 100c may further include a contact welding CW for repairing the disconnected data line DL of the two adjacent data lines DL. For example, in response to one of two adjacent data lines DL being disconnected, the contact welding CW for connecting each of the two data lines DL to the light-shielding pattern SLP3 disposed in a lower part thereof may be formed.

Through the contact welding CW, the disconnected data line may be connected to another data line adjacent thereto and the disconnected data line may thus be repaired. In one example, the contact welding CW may be formed by diffusing a portion of the light-shielding pattern SLP3 toward the data line DL using a laser disposed in the outside of the substrate 101.

As described above, the light-shielding pattern SLP3 may be formed as a line shape in another direction corresponding to metal patterns, that is, the data line DL and the reference line RL, disposed on the interlayer insulating film 103, which may be major factors causing light leakage at a periphery of each pixel area PA. Accordingly, the data line DL and the reference line RL may reflect light emitted from adjacent pixel areas or exterior light, which may prevent light leakage at a periphery of the pixel area and may minimize deterioration in brightness caused by the light-shielding pattern SLP3.

In addition, the light-shielding pattern SLP3 may be formed as a line shape extending in another direction, such that the light-shielding pattern SLP3 may overlap the data line DL and the reference line RL at edges of both sides of the periphery of each pixel area PA, instead of surrounding the periphery of each pixel area PA. Accordingly, in response to one of two adjacent data lines DL disposed between two pixel areas PA being disconnected, the disconnected data line DL may be easily repaired using the light-shielding pattern SLP3 which may be the floating island pattern disposed in a lower part of the two adjacent data lines DL. Accordingly, the yield of the organic light emitting display device may be increased.

Meanwhile, the light-shielding patterns SLP1, SLP2, SLP3 may have a floating state not connected to signal lines such as gate line GL, data line DL, and reference line RL. Alternatively, the light-shielding patterns may be connected to the reference line RL.

Figure 13:
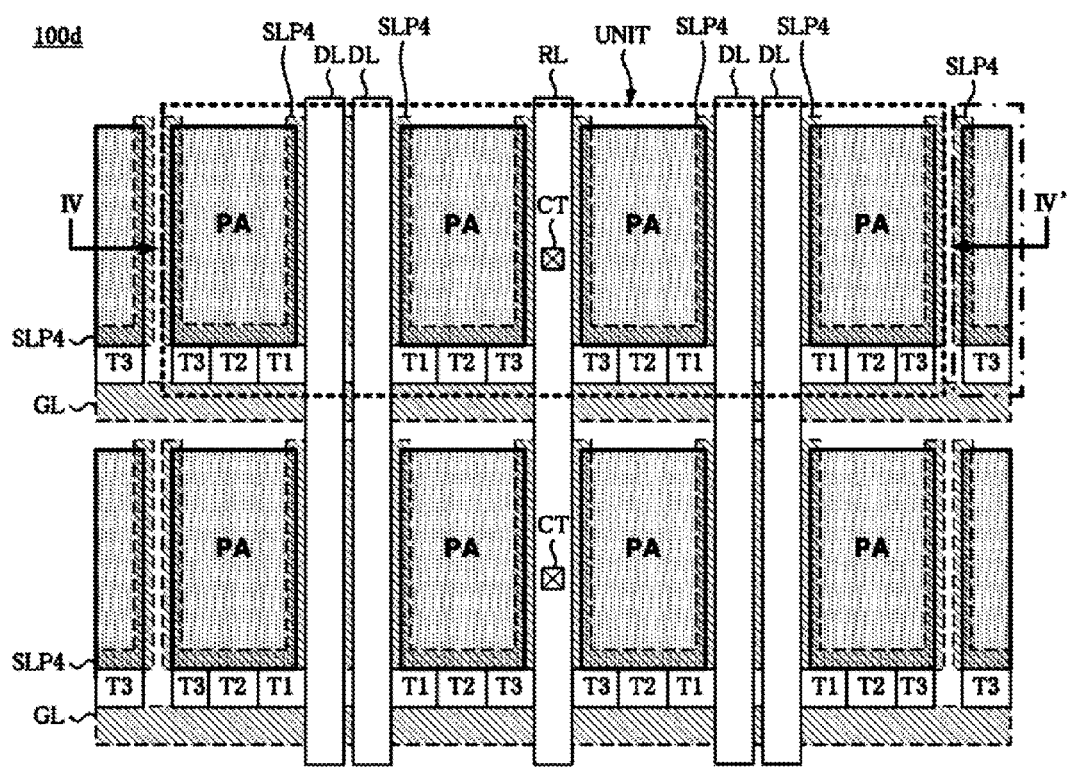
FIG. 13 is a plan view illustrating the organic light emitting display device according to an embodiment.

Hereinafter, an organic light emitting display device according to an embodiment will be described with reference to the examples of FIGS. 13 to 15. FIG. 13 is a plan view illustrating the organic light emitting display device according to an embodiment.

Figure 14:
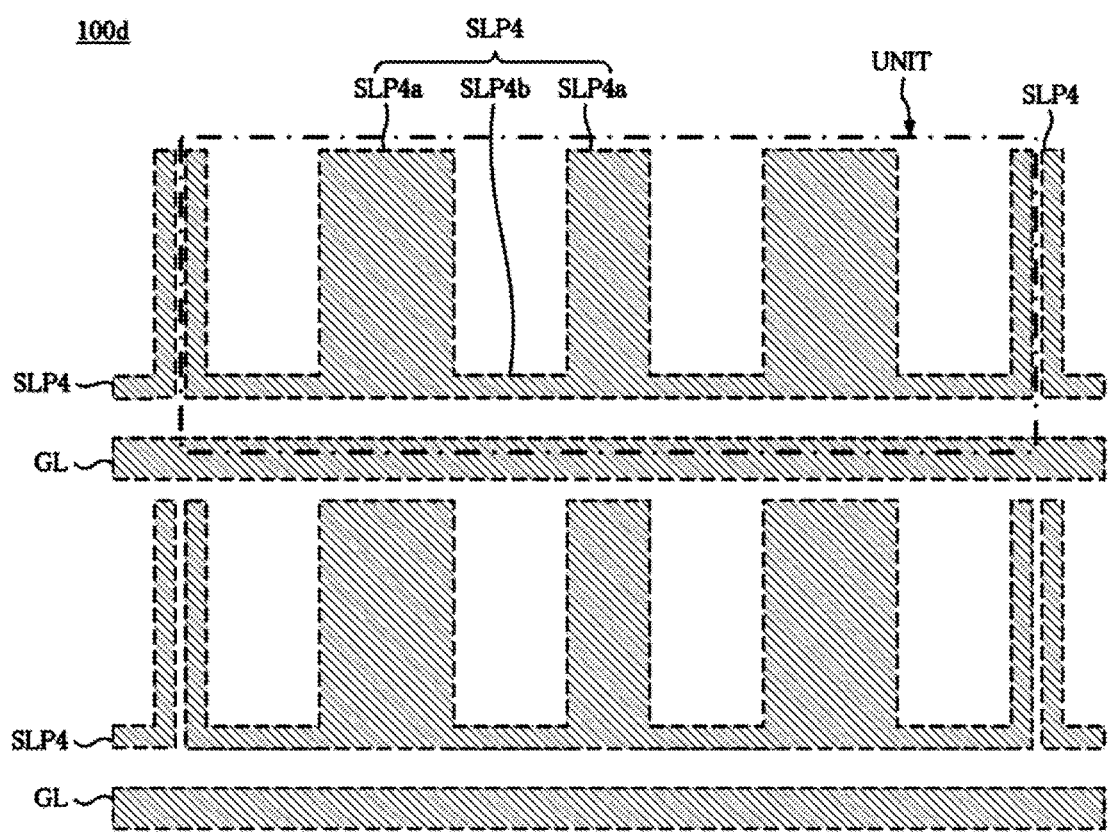
FIG. 14 is a plan view illustrating gate lines and light-shielding patterns of FIG. 13.

FIG. 14 is a plan view illustrating gate lines and light-shielding patterns of FIG. 13. FIG. 15 is a sectional view taken along the line IV-IV' of FIG. 13.

As shown in the FIG. 13 example, a light-shielding pattern SLP4 may correspond to each unit pixel area UNIT, and may be connected to a reference line RL through a contact hole CT. Except for this feature, the organic light emitting display device 100d is the same as that of the organic light emitting display device 100c shown in the examples of FIGS. 9 to 12, and the same features are thus not repeatedly described below.

As shown in the FIG. 14 example, the light-shielding pattern SLP4 may include a plurality of first extension portions SLP4a extending in one direction (e.g., the vertical direction in the FIG. 14 example) along both sides of the periphery of each pixel area PA corresponding to the data line DL and the reference line RL, and a second extension portion SLP4b extending in another direction (e.g., the horizontal direction in the FIG. 14 example) along a side of the periphery of each unit pixel area UNIT and connecting two or more of the first extension portions SLP4a included in the unit pixel area UNIT.

That is, the light-shielding pattern SLP4 may have a fork shape which may include the second extension portion SLP4b extending in one direction along the side of the periphery of each unit pixel area UNIT, and two or more first extension portions SLP4a extending from the second extension portion SLP4b in another direction in parts of the respective peripheries of two or more pixel areas PA1, PA2, PA3, PA4 included in the each unit pixel area UNIT.

Figure 15:
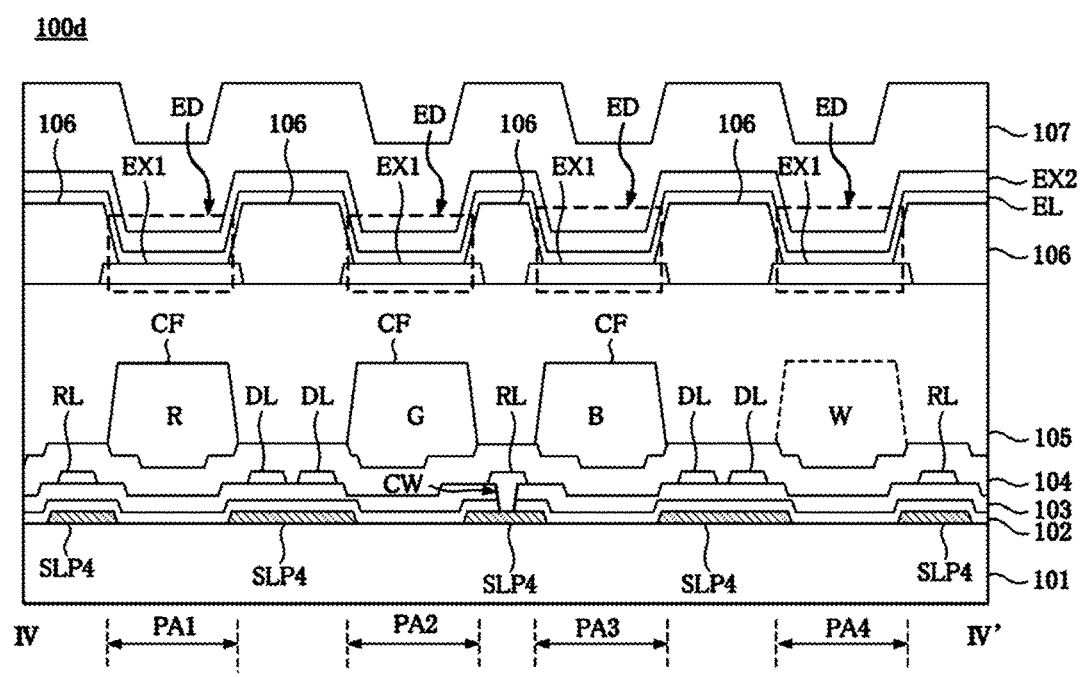
FIG. 15 is a sectional view taken along the line IV-IV' of FIG. 13.

As shown in the FIG. 15 example, the organic light emitting display device 100d may further include a contact hole CT passing through the gate insulating film 102 and the interlayer insulating film 103 and exposing a part of the light-shielding pattern SLP4 in a region in which the light-shielding pattern SLP4 may overlap the reference line RL. The contact hole CT may connect the light-shielding pattern SLP4 corresponding to the each unit pixel area UNIT to the reference line RL.

Although not shown, the third thin film transistor T3 of each pixel area PA may be connected to the reference line RL through the light-shielding pattern SLP4. As a result, the number of the reference lines RL may be reduced to the number of the unit pixel areas UNIT, thus providing an advantage of a higher resolution. In other words, there may be the same number of reference lines RL as there are of unit pixel areas UNIT.

In addition, the light-shielding pattern SLP4 may have the same voltage level as the reference line RL, which may minimize parasitic capacitance between the light-shielding pattern SLP4 and the data line DL. Accordingly, power consumption may be decreased, circuits may become more stable, and reliability of the organic light emitting display device may be improved.

Figure 16:
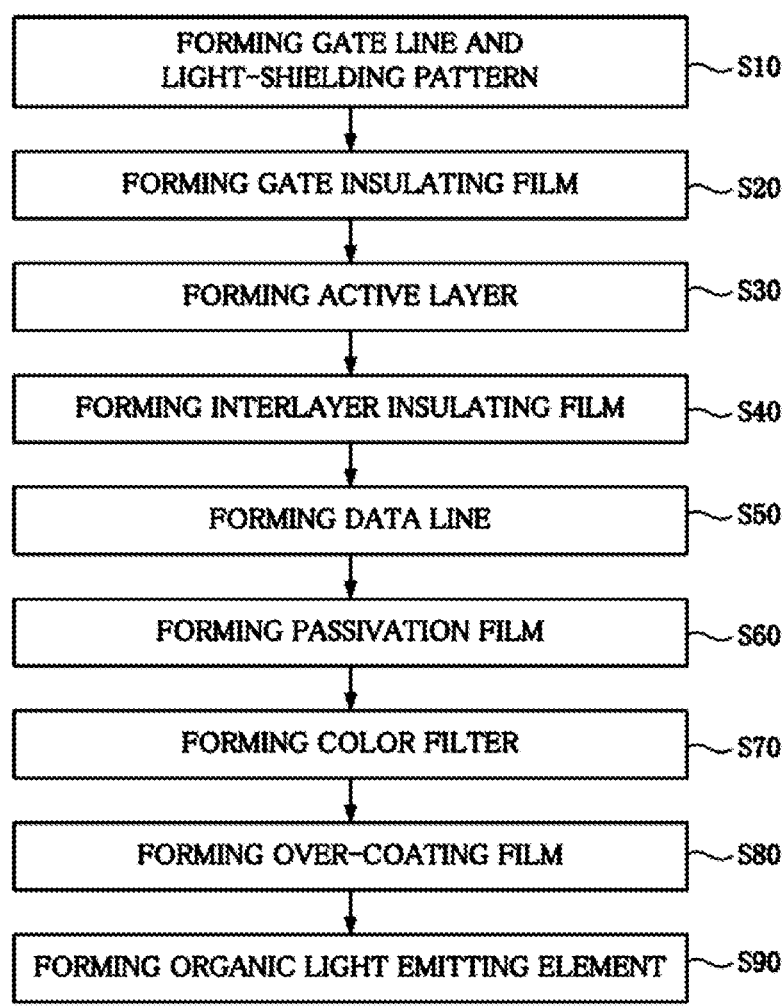
FIG. 16 is a flowchart illustrating a method for manufacturing an organic light emitting display device according to an embodiment.

Next, a method for manufacturing an organic light emitting display device according to embodiments will be described with reference to the examples of FIGS. 16, 17A to 17G, and 18A to 18E. FIG. 16 is a flowchart illustrating a method for manufacturing an organic light emitting display device according to embodiments. FIGS. 17A to 17G and FIGS. 18A to 18E are views illustrating respective operations of the method of FIG. 16.

As shown in the FIG. 16 example, a method for manufacturing an organic light emitting display device may include forming a plurality of gate lines GL in one direction on a substrate 101 and light-shielding patterns (e.g., SLP1, SLP2, SLP3, SLP4) corresponding to at least parts of peripheries of respective pixel areas PA and being spaced from the gate lines GL (S10); forming a gate insulating film 102 over the entire surface of the substrate 101, such that the gate insulating film 102 covers the gate lines GL and the light-shielding patterns SLP1, SLP2, SLP3, SLP4 (S20); forming an active layer ACT on the gate insulating film 102 (S30); forming an interlayer insulating film 103 over the entire surface of the gate insulating film 102, such that the interlayer insulating film 103 covers the active layer ACT (S40); forming a plurality of data lines DL in another direction on the interlayer insulating film 103, such that the data lines DL cross the gate lines GL (S50); forming a passivation film 104 over the entire surface of the interlayer insulating film 103, such that the passivation film 104 covers the data lines DL (S60); forming a plurality of color filters CF in the respective pixel areas PA on the passivation film 104 (S70); evenly forming an over-coating film 105 over the entire surface of the passivation film 104, such that the over-coating film 105 covers the color filters CF (S80); and forming a plurality of organic light emitting elements ED in respective pixel areas PA on the over-coating film 105 (S90).

Figure 17A:
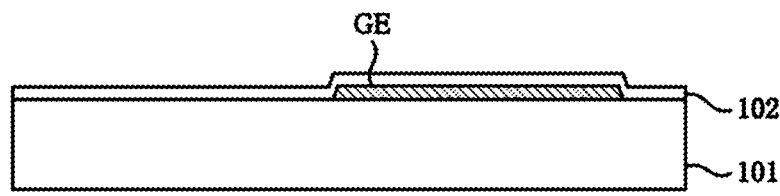
FIGS. 17A to 17G and FIGS. 18A to 18E are views illustrating respective steps of the method of FIG. 16.
Figure 18A:
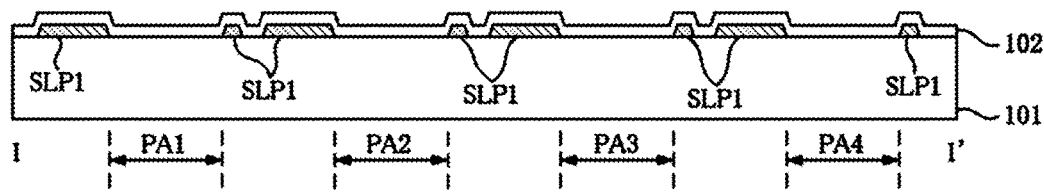

As shown in the examples of FIGS. 17A and 18A, in operation S10, gate lines GL, a gate electrode GE connected thereto, light-shielding patterns SLP1 spaced apart from the gate lines GL, and the gate electrode GE may be formed on a substrate 101. The gate lines GL may be formed in one direction in a display area. The gate electrode GE may branch from the corresponding gate line in each pixel area PA.

The light-shielding pattern SLP1 may be formed in at least a part of the periphery of each pixel area PA. In one example, as shown in FIG. 4, the light-shielding pattern SLP1 may be formed to have a moat shape corresponding to the pixel area PA. That is, the light-shielding pattern SLP1 may surround the periphery of each pixel area PA, and may have an opening in the pixel area PA.

Alternatively, as shown in the FIG. 7 example, the light-shielding pattern SLP2 may be formed to have a window shape corresponding to each unit pixel area UNIT. That is, the light-shielding pattern SLP2 may surround the periphery of each unit pixel area UNIT, and may have an opening in each of two or more pixel areas PA1, PA2, PA3, PA4 included in each unit pixel area UNIT.

As another alternative, as shown in the FIG. 11 example, the light-shielding pattern SLP3 may be formed to have a line shape extending in another direction along both sides of the periphery of each pixel area PA, wherein both sides may correspond to the data line DL and the reference line RL.

As yet another alternative, as shown in the FIG. 14 example, the light-shielding pattern SLP4 may be formed to have a fork shape including the plurality of first extension portions SLP4a extending in another direction (e.g., a vertical direction) along both sides of the periphery of each pixel area PA, wherein both sides may correspond to the data line DL and the reference line RL; and a second extension portion SLP4b extending in one direction (e.g., a horizontal direction) along a side of the periphery of each unit pixel area UNIT and connecting between two or more of the first extension portions SLP4a belonging to each unit pixel area UNIT.

Next, in operation S20, a gate insulating film 102 may be formed over the entire surface of the substrate 101, such that the gate insulating film 102 covers the gate lines GL, the gate electrode GE, and the light-shielding pattern SLP1.

Figure 17B:
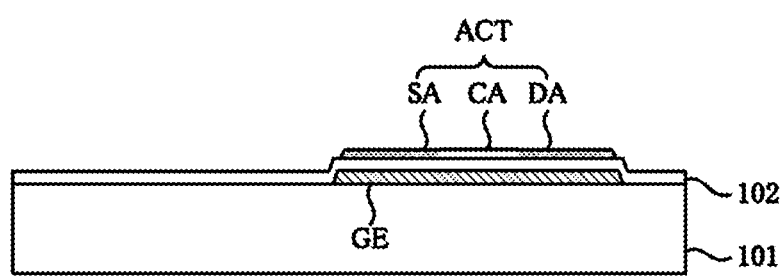

Then, as shown in the FIG. 17B example, in operation S30, an active layer ACT may be formed on the gate insulating film 102. In one example, at least a part of the active layer ACT may overlap the gate electrode GE. In addition, the active layer ACT may include a channel area CA, a source area SA, and a drain area DA. The source area SA and the drain area DA may be disposed at both sides of the channel area CA. The active layer ACT may be formed of one of: an oxide semiconductor, polysilicon (crystalline silicon), and amorphous silicon (a-Si: non-crystalline silicon).

Figure 17C:
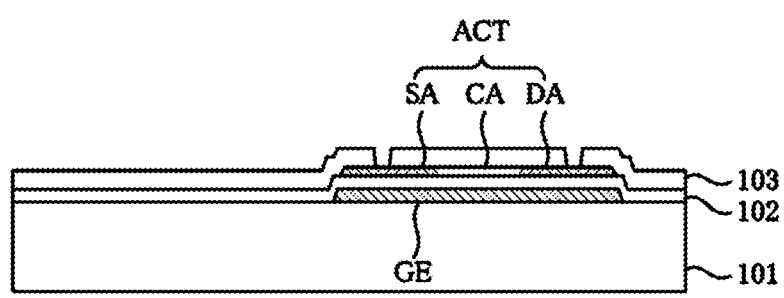

As shown in the FIG. 17C example, in operation S40, an interlayer insulating film 103 may be formed over the entire surface of the gate insulating film 102, such that the interlayer insulating film 103 covers the active layer ACT. In addition, a hole passing through the interlayer insulating film 103 may be formed such that the hole exposes a part of the source area SA and a part of the drain area DA.

Figure 17D:
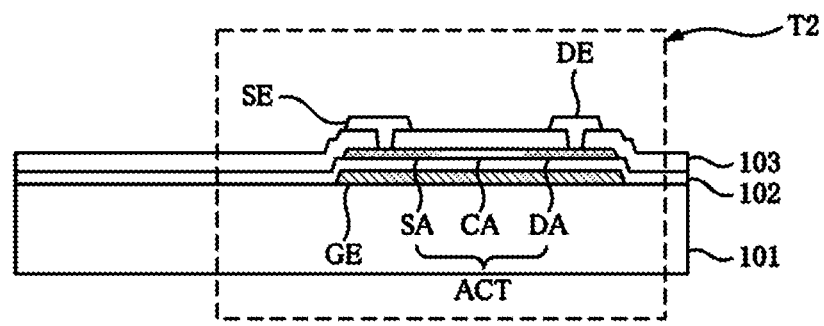
Figure 18B:
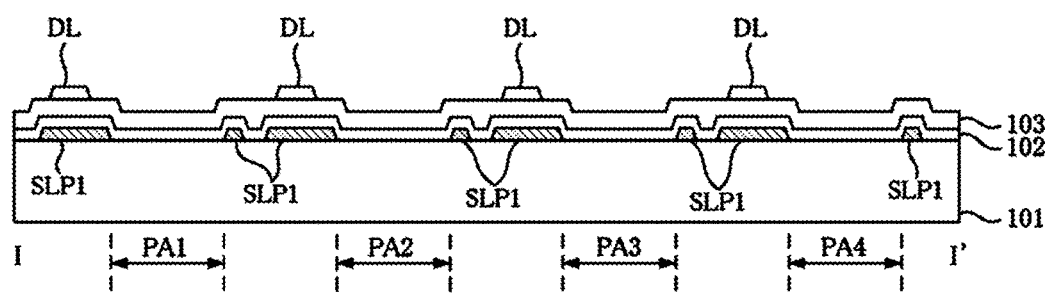

In operation S50, as shown in the examples of FIGS. 17D and FIG. 18B, data lines DL, source electrodes SE, and drain electrodes DE may be formed on the interlayer insulating film 103. The data lines DL may be formed in another direction crossing the gate lines GL in a display area. As described above, the gate lines GL and the data lines DL that cross each other respectively may define a plurality of pixel areas PA. In addition, each data line DL may overlap the light-shielding pattern SLP1.

The source electrode SE may be connected to a source area SA of the active layer ACT through a hole passing through the interlayer insulating film 103, and the drain electrode DE may be connected to a drain area DA of the active layer ACT through a hole passing through the interlayer insulating film 103. In one example, one (e.g., the drain electrode DE) of the source electrode SE and the drain electrode DE may be connected to the data line DL.

Further, as shown in the FIG. 9 example, when the organic light emitting display device 100c further includes a reference line RL, the reference line RL may be further formed in the S50 operation of forming the data lines DL. In this case, the reference line RL may overlap the light-shielding pattern SLP3.

Alternatively, although not explicitly shown, as indicated by the FIG. 15 example, when the organic light emitting display device 100c further includes a contact hole CT for connecting the light-shielding pattern SLP4 to the reference line RL, the contact hole CT passing through the gate insulating film 102 and the interlayer insulating film 103 may be formed, such that the contact hole CT exposes a part of the light-shielding pattern SLP4 before formation of the data lines DL in operation S50.

Figure 17E:
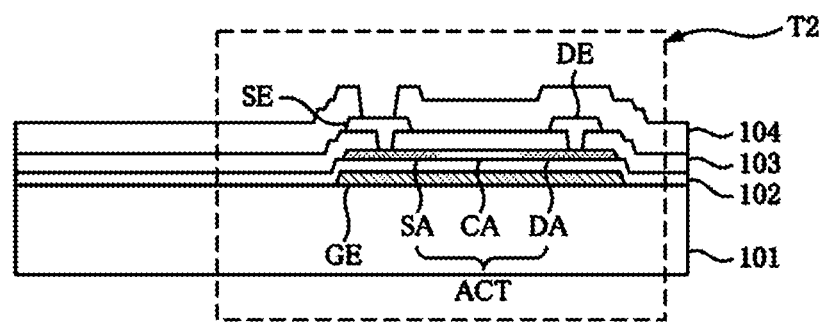
Figure 18C:
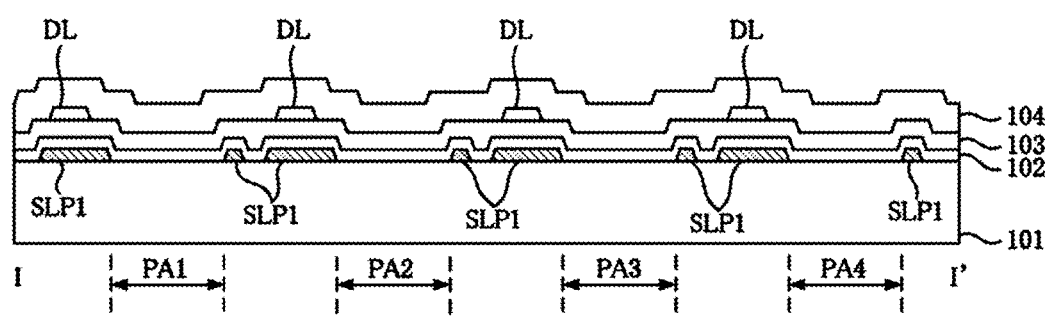

As shown in the examples of FIGS. 17E and 18C, in operation S60, a passivation film 104 may be formed over the entire surface of the interlayer insulating film 103, such that the passivation film 104 covers the data lines DL, the source electrodes SE, and the drain electrodes DE.

Figure 17F:
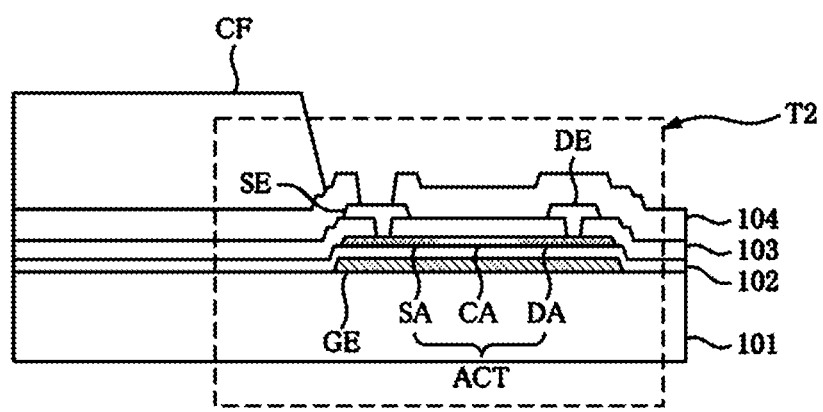
Figure 18D:
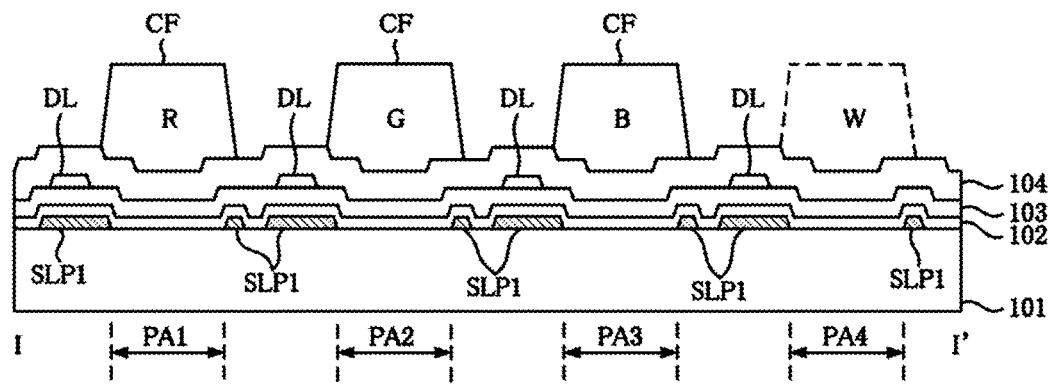
Figure 18E:
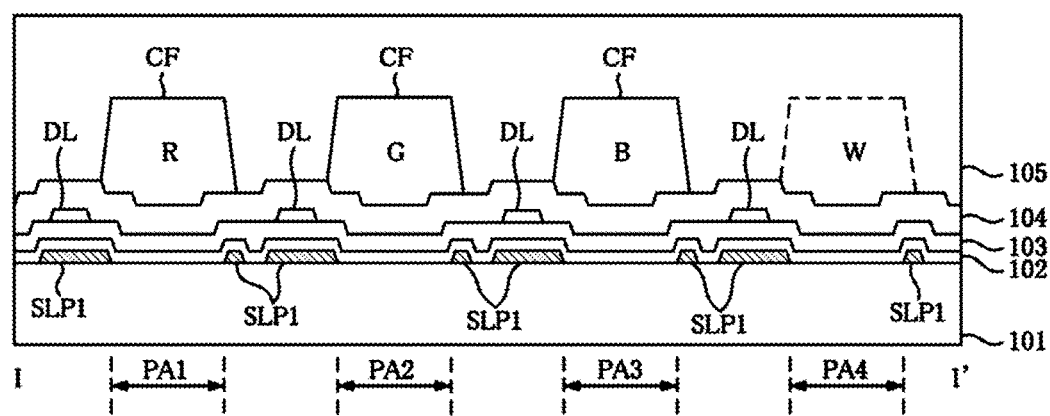

In operation S70, as shown in the FIG. 18D example, color filters CF may be respectively formed in the pixel areas PA on the passivation film 104. Because of the color filters CF, each pixel area PA may emit red, green, or blue light; or red, green, blue or white light. It should be appreciated the embodiments are not limited to these colors. As shown in the FIG. 17F and 18E example, in operation S80, an over-coating film 105 may be formed over the entire surface of the passivation film 104, such that the over-coating film 105 covers the color filters CF.

As shown in the FIG. 17F example, a hole passing through the passivation film 104 and the over-coating film 105 may be formed, such that the hole exposes at least a part of one of the source electrode SE and the drain electrode DE of the second thin film transistor T2. The selected electrode SE, DE may not be connected to the data lines DL. For example, the hole passing through the passivation film 104 and the over-coat film 105 may expose the source electrode SE of the second thin film transistor T2. Alternatively, the hole passing through the passivation film 104 may be formed in operation S60 as shown in the FIG. 17E example.

Figure 17G:
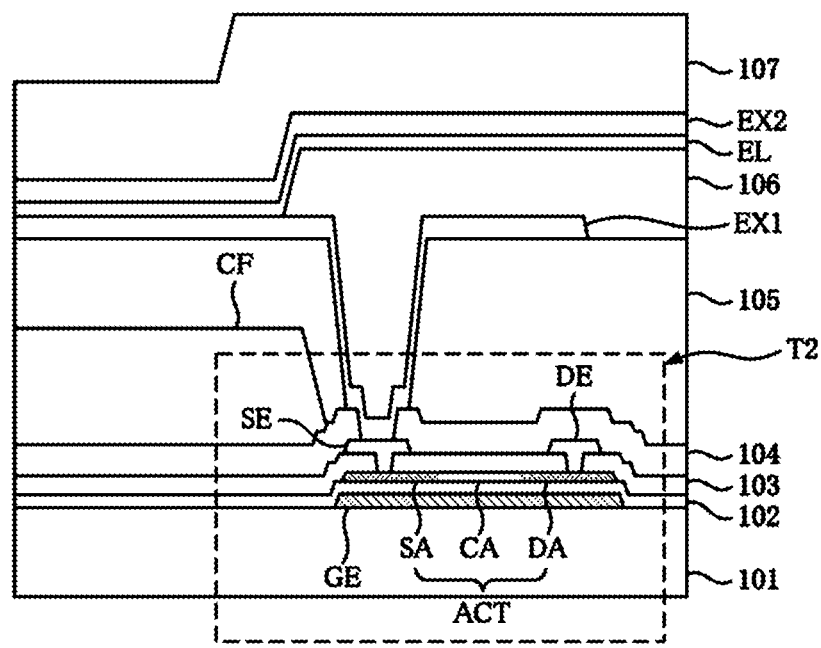

In operation S90, as shown in the example of FIG. 17G, an organic light emitting element ED corresponding to the each pixel area PA may be formed on the over-coating film 105. For example, the operation of forming the organic light emitting element ED may include forming a first electrode EX1 in the each pixel area PA on the over-coating film 105, such that the first electrode EX1 is connected to the second thin film transistor T2 through the hole passing through the passivation film 104 and the over-coating film 105; forming a bank 106 at a periphery of the pixel area PA on the over-coating film 105, such that the bank overlaps an edge of the first electrode EX1; and forming an organic light emitting layer EL and a second electrode EX2 over the entire surface of the first electrode EX1.

Although not explicitly shown, after the operation of forming the organic light emitting element ED (S90), a sealing layer (reference numeral "107" in the examples of FIGS. 3 and 5) may be formed on the organic light emitting element ED. In addition, whether or not the organic light emitting display device is defective may be checked.

As shown in the examples of FIGS. 10 and 12, when the light-shielding pattern SLP3 is formed such that the light-shielding pattern SLP3 overlaps two data lines DL disposed between two pixel areas PA and is a floating island pattern, and one of two adjacent data lines DL is disconnected, the method may further include forming a contact welding CW for connecting each of the two adjacent data lines DL to the light-shielding pattern SLP3 disposed thereunder to repair the disconnected data line DL.

The contact welding CW may be formed by diffusing the light-shielding pattern SLP3 into the data lines DL through irradiation of a laser on the substrate 101 toward the light-shielding pattern SLP3.

As may be apparent from the foregoing description, the organic light emitting display device according to an embodiment may include light-shielding patterns flush with gate lines. As a result, exterior light or light of adjacent different pixel areas may be reflected by metal patterns (for example, data lines), which may prevent light leakage on peripheries of the pixel areas. That is, without forming another light-shielding pattern and/or another black matrix, light leakage on the peripheries in the respective pixel areas may be prevented. The formation of the data lines may include forming the data lines such that the light-shielding patterns overlap the data lines at peripheries of the respective pixel areas. Accordingly, without causing deterioration in brightness by the polarizing film and deterioration in reliability by the black matrix, distortion of color coordinates and deterioration in contrast ratio can be easily prevented and image qualities can be thus improved.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display (OLED) device comprising a plurality of pixel areas defined in a display area, comprising:
 a plurality of gate lines disposed in one direction in the display area on a substrate;
 a plurality of light-shielding patterns formed to correspond to at least parts of peripheries of the respective pixel areas on the substrate, the light-shielding patterns being spaced apart from the gate lines and being formed on a same layer as the gate lines;
 at least one insulating film formed over the substrate, the insulating film covering the gate lines and the light-shielding patterns;
 a plurality of data lines disposed in another direction crossing the gate lines in the display area on the insulating film to define the pixel areas;
 a passivation film disposed over the insulating film, the passivation film covering the data lines;
 a plurality of color filters respectively formed in the pixel areas on and in direct contact with the passivation film;
 an over-coating film evenly formed over and in direct contact with the passivation film, the over-coating film covering the color filters; and
 a plurality of organic light emitting elements respectively formed in the pixel areas on the over-coating film.

2. The organic light emitting display device of claim 1, wherein the light-shielding patterns overlap the data lines.

3. The organic light emitting display device of claim 2, wherein the light-shielding patterns correspond to the peripheries of the respective pixel areas, surround the respective pixel areas, and include openings in the respective pixel areas.

4. The organic light emitting display device of claim 2, wherein:
 two or more neighboring pixel areas, arranged in parallel in the one direction and emitting different colors of light, are defined as a unit pixel area; and
 each of the light-shielding patterns respectively corresponds to each unit pixel area, surrounds a periphery of the unit pixel area, and includes an opening in each of the two or more pixel areas included in the unit pixel area.

5. The organic light emitting display device of claim 2, wherein at least one of the light-shielding patterns is formed to have a line shape extending in the another direction, along a side of the periphery of each pixel area, corresponding to the data line.

6. The organic light emitting display device of claim 5, wherein:
 the data lines are disposed in groups of two, between two adjacent pixel areas disposed in parallel in the one direction;
 the light-shielding pattern overlaps the two adjacent data lines between the two pixel areas; and
 the organic light emitting display device further comprises a contact welding configured to connect each of the two adjacent data lines to the light-shielding pattern overlapping a lower part of the data line to repair a disconnected one of the two adjacent data lines.

7. The organic light emitting display device of claim 5, further comprising:
 a reference line disposed in the another direction in the display area on the insulating film, the reference line being spaced apart from the data line,
 wherein the light-shielding pattern further overlaps the reference line.

8. The organic light emitting display device of claim 2, wherein:
 two or more pixel areas, arranged in parallel in the one direction and emitting different colors of light, are defined as a unit pixel area; and at last one of the light-shielding patterns comprises:
- a plurality of first extension portions extending in the another direction along a side of a periphery of each pixel area in the unit pixel area; and
- a second extension portion extending in the one direction along a side of the periphery of the unit pixel area, the second extension portion connecting the first extension portions in the unit pixel area.

9. The organic light emitting display device of claim 8, further comprising:
- a reference line disposed in the another direction in the display area on the insulating film, the reference line being spaced apart from the data line,
- wherein at least one of the first extension portions of the light-shielding pattern overlaps the data line, and
- wherein another of the at least one of the first extension portions of the light-shielding pattern overlaps the reference line.

10. The organic light emitting display device of claim 9, wherein the light-shielding pattern is connected to the reference line.

11. A method for manufacturing an organic light emitting display (OLED) device comprising a plurality of pixel areas defined in a display area, the method comprising:
- forming a plurality of gate lines in one direction on a substrate;
- forming light-shielding patterns corresponding to at least parts of peripheries of respective pixel areas, the light-shielding patterns being spaced apart from the gate lines and being formed on a same layer as the gate lines;
- forming at least one insulating film over an entire surface of the substrate, such that the gate insulating film covers the gate lines and the light-shielding patterns;
- forming a plurality of data lines in another direction on the interlayer insulating film, such that the data lines cross the gate lines, to define the pixel areas;
- forming a passivation film over an entire surface of the insulating film, such that the passivation film covers the data lines;
- forming a plurality of color filters in the respective pixel areas on and in direct contact with the passivation film;
- evenly forming an over-coating film over an entire surface of and in direct contact with the passivation film, such that the over-coating film covers the color filters; and
- forming a plurality of organic light emitting elements on the over-coating film, such that the organic light emitting elements correspond to the respective pixel areas,
- wherein the formation of the data lines comprises forming the data lines, such that the light-shielding patterns overlap the data lines at peripheries of the respective pixel areas.

12. The method of claim 11, wherein the formation of the light-shielding patterns comprises forming the light-shielding patterns at the peripheries of the respective pixel areas, such that the light-shielding patterns surround the respective pixel areas and include openings in the respective pixel areas.

13. The method of claim 11, wherein:
- two or more pixel areas, arranged in parallel in the one direction and emitting different colors of light, are defined as a unit pixel area; and
- the formation of the light-shielding patterns comprises forming each light-shielding pattern in each unit pixel area, such that the light-shielding pattern surrounds a periphery of the unit pixel area and includes an opening in each of the two or more pixel areas included in the unit pixel area.

14. The method of claim 11, wherein the formation of the light-shielding patterns comprises forming each light-shielding pattern to extend in the another direction along a side corresponding to the data line at the periphery of each pixel area.

15. The method of claim 14, wherein:
- the formation of the data lines comprises forming, in the another direction, a reference line spaced apart from the data line on the insulating film; and
- the formation of the light-shielding patterns comprises forming at least one light-shielding pattern to overlap the data line and the reference line.

16. The method of claim 11, wherein:
- two or more pixel areas, arranged in parallel in the one direction and emitting different colors of light, are defined as a unit pixel area; and
- the formation of the light-shielding patterns comprises forming, for at least one light-shielding pattern:
  - a plurality of first extension portions extending in the another direction along a side of a periphery of each pixel area in the unit pixel area; and
  - a second extension portion extending in the one direction along a side of the periphery of the unit pixel area, the second extension portion connecting the first extension portions in the unit pixel area.

17. The method of claim 16, wherein:
- the formation of the data lines comprises forming a reference line spaced from the data line on the insulating film; and
- the formation of the light-shielding patterns comprises forming the light-shielding patterns, such that each light-shielding pattern further overlaps the reference line at the periphery of each pixel area.

18. The method of claim 11, wherein the light-shielding patterns are formed simultaneously with the gate lines.

* * * * *